United States Patent
Yang et al.

(10) Patent No.: US 12,156,442 B2
(45) Date of Patent: Nov. 26, 2024

(54) ARRAY SUBSTRATE, DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Lulu Yang, Beijing (CN); Tinghua Shang, Beijing (CN); Yi Qu, Beijing (CN); Xiaofeng Jiang, Beijing (CN); Huijun Li, Beijing (CN); Mengqi Wang, Beijing (CN); Xin Zhang, Beijing (CN); Meng Zhang, Beijing (CN)

(73) Assignees: BEIJING BOE TECHNOLOGY DEVELOPMENT CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 844 days.

(21) Appl. No.: 17/262,306

(22) PCT Filed: Mar. 31, 2020

(86) PCT No.: PCT/CN2020/082334
§ 371 (c)(1),
(2) Date: Jan. 22, 2021

(87) PCT Pub. No.: WO2021/195933
PCT Pub. Date: Oct. 7, 2021

(65) Prior Publication Data
US 2022/0115482 A1    Apr. 14, 2022

(51) Int. Cl.
H10K 59/131    (2023.01)
G09G 3/3225    (2016.01)
H10K 59/35    (2023.01)

(52) U.S. Cl.
CPC ......... *H10K 59/131* (2023.02); *G09G 3/3225* (2013.01); *H10K 59/353* (2023.02)

(58) Field of Classification Search
CPC ............... H10K 59/131; H10K 59/353; G09G 2300/0413; G09G 2310/0286;
(Continued)

(56) References Cited

U.S. PATENT DOCUMENTS 9,324,272 B2    4/2016    Liu
2009/0225009 A1    9/2009    Ka
(Continued)

FOREIGN PATENT DOCUMENTS

CN    101527114 A    9/2009
CN    108399895 A    8/2018
(Continued)

OTHER PUBLICATIONS

Extended European search report of counterpart European application No. 20897616.7 issued on Apr. 11, 2023.

*Primary Examiner* — Jasmine J Clark
(74) *Attorney, Agent, or Firm* — Lippes Mathias LLP

(57) ABSTRACT

A display area of the array substrate only includes first sub-pixels capable of emitting light. In each two adjacent rows of first sub-pixels, a gate line electrically connected to one row of the plurality of rows of first sub-pixels and a reset signal line electrically connected to another row of the plurality of rows of first sub-pixels are electrically connected to the same first gate drive circuit. A target line electrically connected to a first row of the plurality of rows of first sub-pixels (i.e., another line other than the line electrically
(Continued)

connected to the first gate drive circuit) is electrically connected to a second gate drive circuit. A target line electrically connected to a last row of the plurality of rows of first sub-pixels (i.e., another line other than the line electrically connected to the first gate drive circuit) is electrically connected to a third gate drive circuit.

17 Claims, 9 Drawing Sheets

(58) Field of Classification Search
CPC ........... G09G 2320/029; G09G 3/3275; G09G 2300/0408; G09G 2300/0426; G09G 2300/0861; G09G 2310/061
USPC .......................................................... 257/40
See application file for complete search history.

(56) References Cited

U.S. PATENT DOCUMENTS

| | | |
|---|---|---|
| 2017/0076665 A1 | 3/2017 | Kim |
| 2020/0201109 A1* | 6/2020 | Zhao ................. G02F 1/133382 |
| 2020/0273411 A1 | 8/2020 | Gao et al. |

FOREIGN PATENT DOCUMENTS

| | | |
|---|---|---|
| CN | 108873525 A | 11/2018 |
| CN | 109147664 A | 1/2019 |
| CN | 109188804 A | 1/2019 |
| CN | 109599062 A | 4/2019 |

* cited by examiner

ARRAY SUBSTRATE, DISPLAY PANEL AND DISPLAY DEVICE

CROSS-REFERENCE TO RELATED APPLICATION

The present application is a 371 of PCT Application No. PCT/CN2020/082334, filed on Mar. 31, 2020, the content of which is incorporated herein by reference.

TECHNICAL FIELD

The present disclosure relates to the field of display technology, and in particular relates to an array substrate, a display panel, and a display device.

BACKGROUND

Active matrix organic light-emitting diodes (AMOLEDs) are widely used in the current display field due to such advantages of self-luminescence, high contrast, and wide color gamut.

SUMMARY

The present disclosure provides an array substrate, a display panel, and a display device. The technical solutions are as follows.

In one aspect, an array substrate is provided. The array substrate includes:
  a base substrate provided with a display area and a peripheral area surrounding the display area;
  a plurality of rows of first sub-pixels disposed in the display area, the plurality of rows of first sub-pixels being luminous pixels, and a boundary of the plurality of rows of first sub-pixels being a boundary of the display area;
  a plurality of gate lines disposed in the display area and the peripheral area, the plurality of rows of first sub-pixels being electrically connected to the plurality of gate lines;
  a plurality of reset signal lines disposed in the display area and the peripheral area, the plurality of rows of first sub-pixels being electrically connected to the plurality of reset signal lines; wherein
  in each two adjacent rows of the plurality of rows of first sub-pixels, a gate line electrically connected to one row of the plurality of rows of first sub-pixels and a reset signal line electrically connected to another row of the plurality of rows of first sub-pixels are electrically connected to the same first gate drive circuit;
  a first target line connected to a first row of the plurality of rows of first sub-pixels is electrically connected to a second gate drive circuit; and a second target line connected to a last row of the plurality of rows of first sub-pixels is electrically connected to a third gate drive circuit; and
  one of the first target line and the second target line is one of the plurality of gate lines, and the other target line is one of the plurality of reset signal lines.

Optionally, the plurality of rows of first sub-pixels is electrically connected to the plurality of gate lines in one-to-one correspondence, and the plurality of rows of first sub-pixels is electrically connected to the plurality of reset signal lines in one-to-one correspondence.

Optionally, in each two adjacent rows of first sub-pixels, a gate line electrically connected to an odd-numbered row of the plurality of rows of first sub-pixels and a reset signal line electrically connected to an even-numbered row of the plurality of rows of first sub-pixels are electrically connected to the same first gate drive circuit; and
  the first target line is one of the plurality of reset signal lines, and the second target line is one of the plurality of gate lines.

Optionally, in each two adjacent rows of the plurality of rows of first sub-pixels, a reset signal line electrically connected to an odd-numbered row of the plurality of rows of first sub-pixels and a gate line electrically connected to an even-numbered row of the plurality of rows of first sub-pixels are electrically connected to the same first gate drive circuit; and
  the first target line is one of the plurality of gate lines, and the second target line is one of the plurality of reset signal lines.

Optionally, in each two adjacent rows of the plurality of rows of first sub-pixels, a gate line electrically connected to one row of the plurality of rows of first sub-pixels is connected to a reset signal line electrically connected to another row of the plurality of rows of first sub-pixels and both are electrically connected to the same first gate drive circuit.

Optionally, in each two adjacent rows of the plurality of rows of first sub-pixels, a gate line electrically connected to one row of the plurality of rows of first sub-pixels is connected to a reset signal line electrically connected to another row of the plurality of rows of first sub-pixels and both are electrically connected to the same first gate drive circuit by the gate line.

Optionally, the array substrate includes:
  a plurality of first gate drive circuits disposed in the peripheral area;
  the second gate drive circuit disposed in the peripheral area and on one side of the plurality of first gate drive circuits; and
  the third gate drive circuit disposed in the peripheral area and on one side of the plurality of first gate drive circuits distal from the second gate drive circuit.

Optionally, in each two adjacent rows of the plurality of rows of first sub-pixels a gate line electrically connected to one row of the plurality of rows of first sub-pixels and a reset signal line electrically connected to another row of the plurality of rows of first sub-pixels are electrically connected to the same first gate drive circuit.

Optionally, in each two adjacent rows of the plurality of rows of first sub-pixels, a gate line electrically connected to one row of the plurality of rows of first sub-pixels and a reset signal line connected to another row of first sub-pixels are electrically connected to two of the first gate drive circuits.

Optionally, the two first gate drive circuits electrically connected to each two adjacent rows of the plurality of rows of first sub-pixels are oppositely disposed at two ends of the two adjacent rows of the plurality of rows of first sub-pixels.

Optionally, the first target line electrically connected to the first row of the plurality of rows of first sub-pixels is electrically connected to two second gate drive circuits, and the second target line electrically connected to the last row of the plurality of rows of first sub-pixels is electrically connected to two of the third gate drive circuits.

Optionally, the array substrate further includes:
  a plurality of light emission control signal lines disposed in the display area and the peripheral area, the plurality of rows of first sub-pixels being electrically connected to the plurality of light emission control signal lines in one-to-one correspondence.

Optionally, a light emission control signal line electrically connected to each row of the plurality of rows of first sub-pixels is electrically connected to a light emission drive circuit, and the light emission drive circuits electrically connected to the light emission control signal lines electrically connected to the plurality of rows of first sub-pixels are different.

Optionally, the light emission control signal lines electrically connected to the plurality of rows of first sub-pixels are electrically connected to the same light emission drive circuit, and the first sub-pixels electrically connected to the same light emission drive circuit are disposed in different rows.

Optionally, the array substrate includes: the light emission drive circuit disposed in the peripheral area.

Optionally, each of the first sub-pixels includes: a pixel circuit and a light-emitting unit electrically connected to the pixel circuit, the pixel circuit is electrically connected to the gate line, the reset signal line, and the light-emitting unit, and the pixel circuit is configured to drive the light-emitting unit to emit light in response to a gate drive signal provided by the gate line and a reset signal provided by the reset signal line.

Optionally, the pixel circuit is also electrically connected to the light emission control signal line;

the pixel circuit is configured to drive the light-emitting unit to emit light in response to the gate drive signal, the reset signal, and a light emission control signal provided by the light emission control signal line.

Optionally, the array substrate further includes:

a plurality of rows of second sub-pixels disposed in the peripheral area and on one side of the second gate drive circuit distal from the first gate drive circuit, the plurality of rows of second sub-pixels being non-luminous pixels.

In another aspect, a display panel is provided. The display panel includes a packaging cover plate and an array substrate as described in the above aspect.

In yet another aspect, a display device is provided. The display device includes a drive circuit and a display panel as described in the above aspect. The drive circuit is electrically connected to the display panel. The drive circuit is configured to drive the display panel. The operation of the display panel is described.

BRIEF DESCRIPTION OF DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

In order to make the objects, technical solutions, and advantages of the present disclosure clearer, the embodiments of the present disclosure are further described in detail hereinafter with reference to the accompanying drawings.

At present, in order to ensure that among a plurality of rows of display sub-pixels that can emit light in a display area of an array substrate, the load difference on reset signal lines electrically connected to plurality of rows of display sub-pixels is small, that is, the reset signal lines included in the array substrate are all in the same working environment, generally, a row of non-luminous dummy sub-pixels adjacent to a first row of the plurality of rows of display sub-pixels is disposed at the top of the display area, that is, at the boundary of the display area, and a gate line is electrically connected to the row of dummy sub-pixels.

By this arrangement structure, when in each two adjacent rows of the plurality of rows of display sub-pixels, a reset signal line electrically connected to an odd-numbered row of the plurality of rows of display sub-pixels and a gate line electrically connected to an even-numbered row of the plurality of rows of display sub-pixels are electrically connected to the same gate drive circuit, a reset signal line electrically connected to the first row of the plurality of rows of display sub-pixels and a gate line electrically connected to dummy sub-pixels adjacent thereto may be electrically connected to the same gate drive circuit. Furthermore, it is ensured that the reset signal lines electrically connected to the plurality of rows of display sub-pixels are all in the same working environment. In addition, other signal lines other than the gate line (for example, light emission control signal lines) are generally disposed to be electrically connected to the dummy sub-pixels. Accordingly, in order to ensure the working stability of the other signal lines electrically connected to the dummy sub-pixels, a DC signal terminal that provides a DC signal is disposed to be electrically connected to other signal lines.

However, the arrangement of the dummy sub-pixels and the introduction of signal lines electrically connected to the dummy sub-pixels make the design of the array substrate more complicated. With the development of display technology, the structure of the pixel circuit included in the pixel has become more and more complex, and the requirements for the space utilization of the array substrate are getting higher and higher. In order to achieve better design in a limited space, a simple and effective layout becomes very important. An embodiment of the present disclosure provides an array substrate, which can not only ensure that the normal display is not affected, but also has fewer wiring, simpler design, and lower manufacturing cost.

Figure 1:
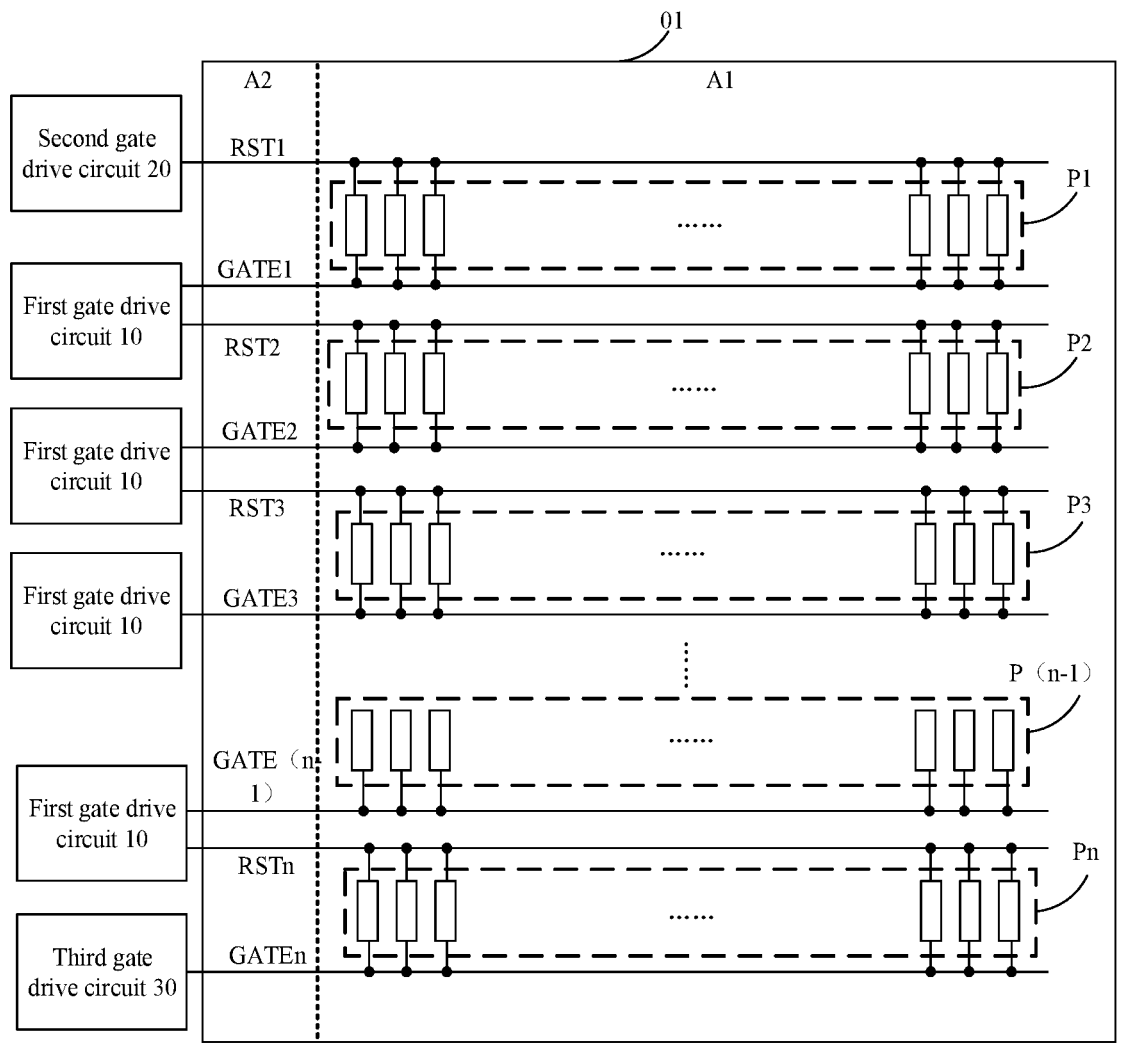
FIG. 1 is a schematic structural diagram of an array substrate according to an embodiment of the present disclosure.

FIG. 1 is a schematic structural diagram of an array substrate according to an embodiment of the present disclosure. As shown in FIG. 1, the array substrate may include:

a base substrate 01 provided with a display area A1 and a peripheral area A2 surrounding the display area A1.

A plurality of rows of first sub-pixels (n rows of first sub-pixels P1 to Pn as shown in FIG. 1) are disposed in the display area A1. The plurality of rows of first sub-pixels is luminous pixels. A boundary of the plurality of rows of first sub-pixels is a boundary of the display area A1. That is, the display area A1 is an outer edge contour of the plurality of rows of first sub-pixels. N is an integer greater than zero. Since the first sub-pixel is a luminous pixel, the first sub-pixel may also be referred to as a display sub-pixel.

A plurality of gate lines (n gate lines GATE1 to GATEn as shown in FIG. 1) are disposed in the display area A1 and the peripheral area A2. The plurality of rows of first sub-pixels may be electrically connected to the plurality of gate lines.

A plurality of reset signal lines (n reset signal lines RST1 to RSTn as shown in FIG. 1) are disposed in the display area A1 and the peripheral area A2. The plurality of rows of first sub-pixels may be electrically connected to the plurality of reset signal lines.

In each two adjacent rows of the plurality of rows of first sub-pixels, a gate line electrically connected to one row of the plurality of rows of first sub-pixels and a reset signal line electrically connected to another row of the plurality of rows of first sub-pixels may be electrically connected to the same first gate drive circuit 10.

A first target line connected to a first row of the plurality of rows of first sub-pixels may be electrically connected to a second gate drive circuit 20. A second target line connected to a last row of the plurality of rows of first sub-pixels may be electrically connected to a third gate drive circuit 30. One of the first target line and the second target line may be one of the plurality of gate lines, and the other target line may be one of the plurality of reset signal lines.

For example, still referring to FIG. 1, in the array substrate shown, the first target line is a first reset signal line RST1 among the plurality of reset signal lines. The second target line L2 is a last gate line GATEn among the plurality of gate lines. Moreover, a first row of first sub-pixels P1 may be electrically connected to a first gate line GATE1 and the first reset signal line RST1 correspondingly. A second row of first sub-pixels P2 may be electrically connected to a second gate line GATE2 and a second reset signal line RST2 correspondingly. A third row of first sub-pixels P3 is electrically connected to a third gate line GATE3 and a third reset signal line RST3 correspondingly; and so on.

The gate line GATE1 electrically connected to the first row of first sub-pixels P1 and the reset signal line RST2 electrically connected to the second row of first sub-pixels P2 are electrically connected to the same first gate drive circuit 10. The gate line GATE2 electrically connected to the second row of first sub-pixels P2 and the reset signal line RST3 electrically connected to the third row of first sub-pixels P3 may be electrically connected to the same another first gate drive circuit 10; and so on, until a gate line GATE(n−1) electrically connected to an $(n-1)^{th}$ row of first sub-pixels P(n−1) and a reset signal line RSTn electrically connected to an $n^{th}$ row of first sub-pixels Pn are electrically connected to the same last first gate drive circuit 10.

The reset signal line RST1 (i.e., the first target line) electrically connected to the first row of first sub-pixels P1 may be electrically connected to the second gate drive circuit 20. The gate line GATEn (i.e., the second target line) electrically connected to the nth row of first sub-pixels Pn may be electrically connected to the third gate drive circuit 30.

Moreover, in order to ensure normal drive, the reset signal lines electrically connected to different rows of first sub-pixels, that is, the gate drive circuits electrically connected to different reset signal lines, may be different. The gate lines electrically connected to different rows of first sub-pixels, that is, the gate drive circuits electrically connected to different gate lines, may be different. For example, still referring to FIG. 1, the reset signal line RST1 electrically connected to the first row of first sub-pixels P1 is connected to the second gate drive circuit 20, the reset signal line RST2 electrically connected to the second row of first sub-pixels P2 is connected to one first gate drive circuit 10, and the reset signal line RST3 electrically connected to the third row of first sub-pixels P3 is connected to another first gate drive circuit 10, and so on. The gate line GATE1 electrically connected to the first row of first sub-pixels P1 is connected to one first gate drive circuit 10, and the gate line GATE2 electrically connected to the second row of first sub-pixels P2 is connected to another first gate drive circuit 10, and the like.

In the embodiment of the present disclosure, by the signal line electrically connected to each gate drive circuit, the gate drive circuit may provide a signal to the first sub-pixel electrically connected to the signal line to drive the first sub-pixel to emit light. For example, with respect to the array substrate shown in FIG. 1, in order to ensure normal display, the second gate drive circuit 20 may be controlled to output a reset signal to the first row of first sub-pixels P1 by the reset signal line RST1 electrically connected thereto to reset the first row of first sub-pixels P1. Then, the first one of the first gate drive circuits 10 is controlled to output a gate drive signal to the first row of first sub-pixels P1 by the gate line GATE1 electrically connected thereto to drive the first row of first sub-pixels P1 to emit light. Simultaneously, the first one of the first gate drive circuits 10 may also output a reset signal to the second row of first sub-pixels P2 by the reset signal line RST2 electrically connected thereto, in order to reset the second row of first sub-pixels P2. Then, the second one of the first gate drive circuits 10 is controlled to output a gate drive signal to the second row of first sub-pixels P2 by the gate line GATE2 electrically connected thereto to drive the second row of first sub-pixels P2 to emit light. Simultaneously, the second one of the first gate drive circuits 10 may also output a reset signal to the third row of first sub-pixels P3 by the reset signal line RST3 electrically connected thereto, in order to reset the third row of first sub-pixels P3, and so on. The driving of other rows will not be repeated. By this drive method, progressive driving of the rows of first sub-pixels may be reliably realized.

In summary, the embodiment of the present disclosure provides an array substrate. With respect to the electrical connection relationship of the first sub-pixels, the signal lines, and the gate drive circuits of the array substrate, it may be seen that during normal operation, each gate drive circuit may be flexibly controlled to provide a signal to a signal line electrically connected thereto to realize reliable progressive driving of the first sub-pixels. In addition, since there are no non-luminous dummy sub-pixels in the display area of the array substrate, compared to the array substrate in the related art, the array substrate can not only display normally, but also has a simpler design.

Optionally, in the embodiment of the present disclosure, with respect to FIG. 1, the plurality of rows of first sub-pixels may be electrically connected to the plurality of gate lines in one-to-one correspondence. The plurality of rows of first sub-pixels may be electrically connected to the plurality of reset signal lines in one-to-one correspondence. Each gate drive circuit (i.e., the second gate drive circuit 20, the first gate drive circuits 10 and the third gate drive circuit 30) may be disposed outside the array substrate independently of the array substrate. Alternatively, each gate drive circuit may also be disposed on the array substrate. That is, as shown in FIG. 2, the array substrate may further include:

a plurality of first gate drive circuits 10 disposed in the peripheral area A2 of the base substrate 01; the second gate drive circuit 20 disposed in the peripheral area A2 of the base substrate 01 and on one side of the plurality of first gate drive circuits 10; and the third gate drive circuit 30 disposed in the peripheral area A2 of the base substrate 01 and on one side of the plurality of first gate drive circuits 10 distal from the second gate drive circuit 20. Accordingly, each gate drive circuit may also be referred to as a gate on array (GOA) unit.

By arranging the gate drive circuits on the array substrate, it is beneficial to the narrow frame design. In the following embodiments, each gate drive circuit is disposed on the array substrate as an example for description. FIG. 2 and the figures involved in the following embodiments all use GOA1 to represent the first gate drive circuit 10, GOA2 to represent the second gate drive circuit 20, and GOA3 to represent the third gate drive circuit 30.

Figure 2:
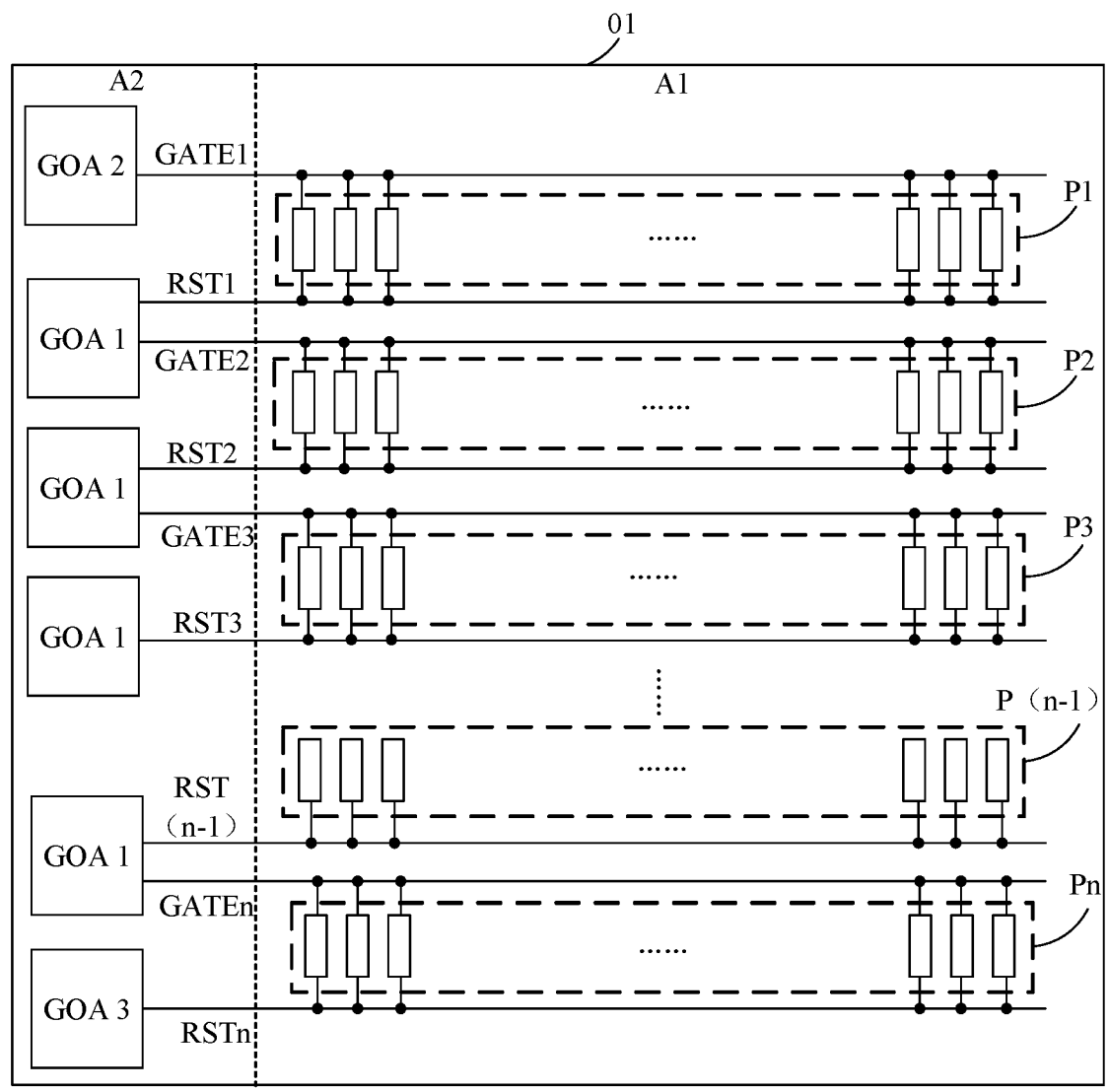
FIG. 2 is a schematic structural diagram of another array substrate according to an embodiment of the present disclosure.

Optionally, with reference to FIG. 2, the second gate drive circuit 20, the first gate drive circuits 10, and the third gate drive circuit 30 according to the embodiments of the present disclosure may be disposed on the array substrate in order along an extension direction perpendicular to the gate lines. In addition, each two adjacent gate drive circuits may be cascaded (not shown), and activated sequentially in the cascaded sequence. A circuit composed of the second gate drive circuit 20, the first gate drive circuits 10 and the third gate drive circuit 30 may be referred to as a gate drive device.

It should be noted that, for each gate drive circuit included in the gate drive device, the gate drive device may start to work sequentially from the second gate drive circuit 20. That is, the gate drive device may start driving the plurality of rows of first sub-pixels included in the array substrate from the first row of the plurality of rows of first sub-pixels progressively. This scanning method may also be referred to as forward scanning. In addition, the gate drive device may also start to work sequentially from the third gate drive circuit 30. That is, the gate drive device may start driving the plurality of rows of first sub-pixels included in the array substrate from the last row of the plurality of rows of first sub-pixels progressively. This scanning method may also be referred to as reverse scanning To achieve normal drive, for forward scanning, it is necessary to provide a reset signal to the first row of the plurality of rows of first sub-pixels by the reset signal line electrically connected to the first row of the plurality of rows of first sub-pixels. For reverse scanning, it is necessary to provide a reset signal to the last row of the plurality of rows of first sub-pixels by the reset signal line electrically connected to the last row of the plurality of rows of first sub-pixels. With respect to the cascaded arrangement of the gate drive circuits, in order to ensure reliable progressive driving, in the forward scanning scenario, the second gate drive circuit 20 needs to be electrically connected to the reset signal line electrically connected to the first row of the plurality of rows of first sub-pixels. In the reverse scanning scenario, the third gate drive circuit 30 needs to be electrically connected to the reset signal line electrically connected to the last row of the plurality of rows of first sub-pixels.

Therefore, as an optional implementation, with respect to FIG. 1, in each two adjacent rows of first sub-pixels, a gate line electrically connected to an odd-numbered row of the plurality of rows of first sub-pixels and a reset signal line electrically connected to an even-numbered row of the plurality of rows of first sub-pixels may be electrically connected to the same first gate drive circuit 10. Accordingly, referring to FIG. 1, the first target line may be one of the plurality of reset signal lines (RST1 shown in FIG. 1). The second target line may be one of the plurality of gate lines (GATEn as shown in FIG. 1).

With respect to the cascaded relationship, arrangement and drive principle of the above-mentioned gate drive circuits, it may be known that for the array substrate structure shown in FIG. 1, the gate drive device can realize progressive driving of the rows of first sub-pixels by forward scanning. Compared to the related art, since no dummy sub-pixels are provided at the boundary of the display area of the array substrate, the headspace is effectively saved under the premise of ensuring normal display. In addition, since no dummy sub-pixels are provided, there is no need to provide signal lines electrically connected to the dummy sub-pixels in the array substrate, which simplifies the wiring.

As another optional implementation, continuing to refer to FIG. 2, in each two adjacent rows of first sub-pixels, a reset signal line electrically connected to an odd-numbered row of the plurality of rows of first sub-pixels and a gate line electrically connected to an even-numbered row of the plurality of rows of first sub-pixels may be electrically connected to the same first gate drive circuit 10. Accordingly, referring to FIG. 2, the first target line may be one of the plurality of gate lines (GATE1 shown in FIG. 2). The second target line may be one of the plurality of reset signal lines (RSTn shown in FIG. 2).

For example, FIG. 2 continues to illustrate an array substrate including n rows of first sub-pixels P1 to Pn, n gate lines GATE1 to GATEn, and n reset signal lines RST1 to RSTn as an example. Referring to FIG. 2, in the array substrate, the reset signal line RST1 electrically connected to the first row of first sub-pixels P1 and the gate line GATE2 electrically connected to the second row of first sub-pixels P2 are electrically connected to the same first gate drive circuit 10 (i.e., the first GOA1 shown in FIG. 2). The reset signal line RST2 electrically connected to the second row of first sub-pixels P2 and the gate line GATE3 electrically connected to the third row of first sub-pixels P3 may be electrically connected to the same another first gate drive circuit 10 (i.e., the second GOA1 shown in FIG. 2); and so on, until the reset signal line RST(n−1) electrically connected to the $(n-1)^{th}$ row of first sub-pixels P(n−1) and the gate line GATEn electrically connected to the $n^{th}$ row of first sub-pixels Pn are electrically connected to the same last first gate drive circuit 10 (i.e., the last GOA1 shown in FIG. 2). The gate line GATE1 electrically connected to the first row of first sub-pixels P1 may be electrically connected to the second gate drive circuit 20 (i.e., GOA2 shown in FIG. 2). The reset signal line RSTn electrically connected to the $n^{th}$ row of first sub-pixels Pn may be electrically connected to the third gate drive circuit 30 (i.e., GOA3 shown in FIG. 2).

With respect to the cascaded relationship, arrangement and drive principle of the above-mentioned gate drive circuits, it may be known that for the array substrate structure shown in FIG. 2, the gate drive device can realize progressive driving of the rows of first sub-pixels by reverse scanning.

Optionally, FIG. 1 and FIG. 2 show that in each two adjacent rows of the plurality of rows of first sub-pixels, a reset signal line electrically connected to one row of the plurality of rows of first sub-pixels and a gate line electrically connected to another row of the plurality of rows of first sub-pixels are electrically connected to the same first gate drive circuit 10 as an example for description.

Figure 3:
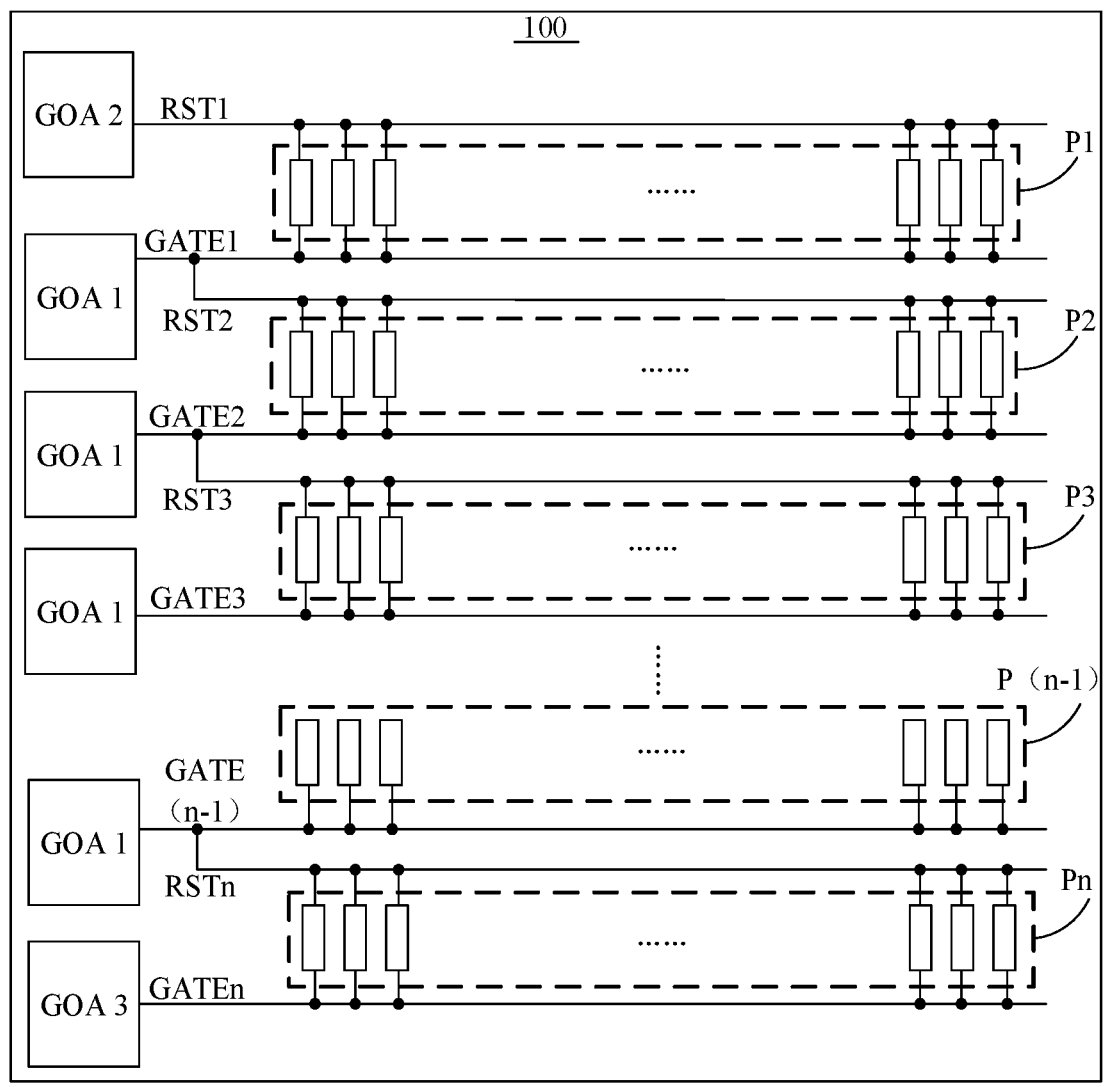
FIG. 3 is a schematic structural diagram of yet another array substrate according to an embodiment of the present disclosure.

However, in order to further simplify the wiring design and save the design cost, for example, in each two adjacent rows of the plurality of rows of first sub-pixels, a gate line electrically connected to an odd-numbered row of the plurality of rows of first sub-pixels and a reset signal line electrically connected to an even-numbered row of the plurality of rows of first sub-pixels are electrically connected to the same first gate drive circuit 10, the first target line is a reset signal line, and the second target line is a gate line. FIG. 3 shows another array substrate. Referring to FIG. 3, a gate line electrically connected to one row of the plurality of rows of first sub-pixels and a reset signal line electrically connected to another row of the plurality of rows of first sub-pixels included in an array substrate 100 may be electrically connected to the same first gate drive circuit 10.

Optionally, after the gate line electrically connected to one row of the plurality of rows of first sub-pixels is connected to the reset signal line electrically connected to another row of the plurality of rows of first sub-pixels, they may be electrically connected to the same first gate drive circuit 10 by the gate line or the reset signal line.

For example, in the array substrate 100 shown in FIG. 3, after a gate line electrically connected to an odd-numbered row of the plurality of rows of first sub-pixels and a reset signal line electrically connected to an even-numbered row of the plurality of rows of first sub-pixels are connected, they may both be electrically connected to the first gate drive circuit 10 by the gate line. That is, with reference to FIG. 3, the gate line GATE1 electrically connected to the first row of first sub-pixels P1 and the reset signal line RST2 electrically connected to the second row of first sub-pixels P2 may be electrically connected to the first one of the first gate drive circuits 10 (i.e., the first GOA1 shown in FIG. 3) by the gate line GATE1. The gate line GATE2 electrically connected to the second row of first sub-pixels P2 may be electrically connected to the reset signal line RST3 electrically connected to the third row of first sub-pixels P3, and they may both be electrically connected to the second one of the first gate drive circuits 10 (i.e., the second GOA1 shown in FIG. 3) by the gate line GATE2; and so on.

Optionally, in the embodiment of the present disclosure, with respect to FIGS. 1 to 3, in each two adjacent rows of the plurality of rows of first sub-pixels, a gate line electrically connected to one row of the plurality of rows of first sub-pixels and a reset signal line electrically connected to another row of the plurality of rows of first sub-pixels may be only electrically connected to the same first gate drive circuit 10.

Alternatively, the gate line electrically connected to one row of the plurality of rows of first sub-pixels and the reset signal line electrically connected to another row of the plurality of rows of first sub-pixels may both be electrically connected to two first gate drive circuits 10. Furthermore, optionally, the two first gate drive circuits 10 electrically connected to each two adjacent rows of first sub-pixels may be oppositely disposed at two ends of two adjacent rows of the plurality of rows of first sub-pixels. In addition, the first target line electrically connected to the first row of the plurality of rows of first sub-pixels may also be electrically connected to two second gate drive circuits 20. The second target line electrically connected to the last row of the plurality of rows of first sub-pixels may also be electrically connected to two third gate drive circuits 30.

Figure 4:
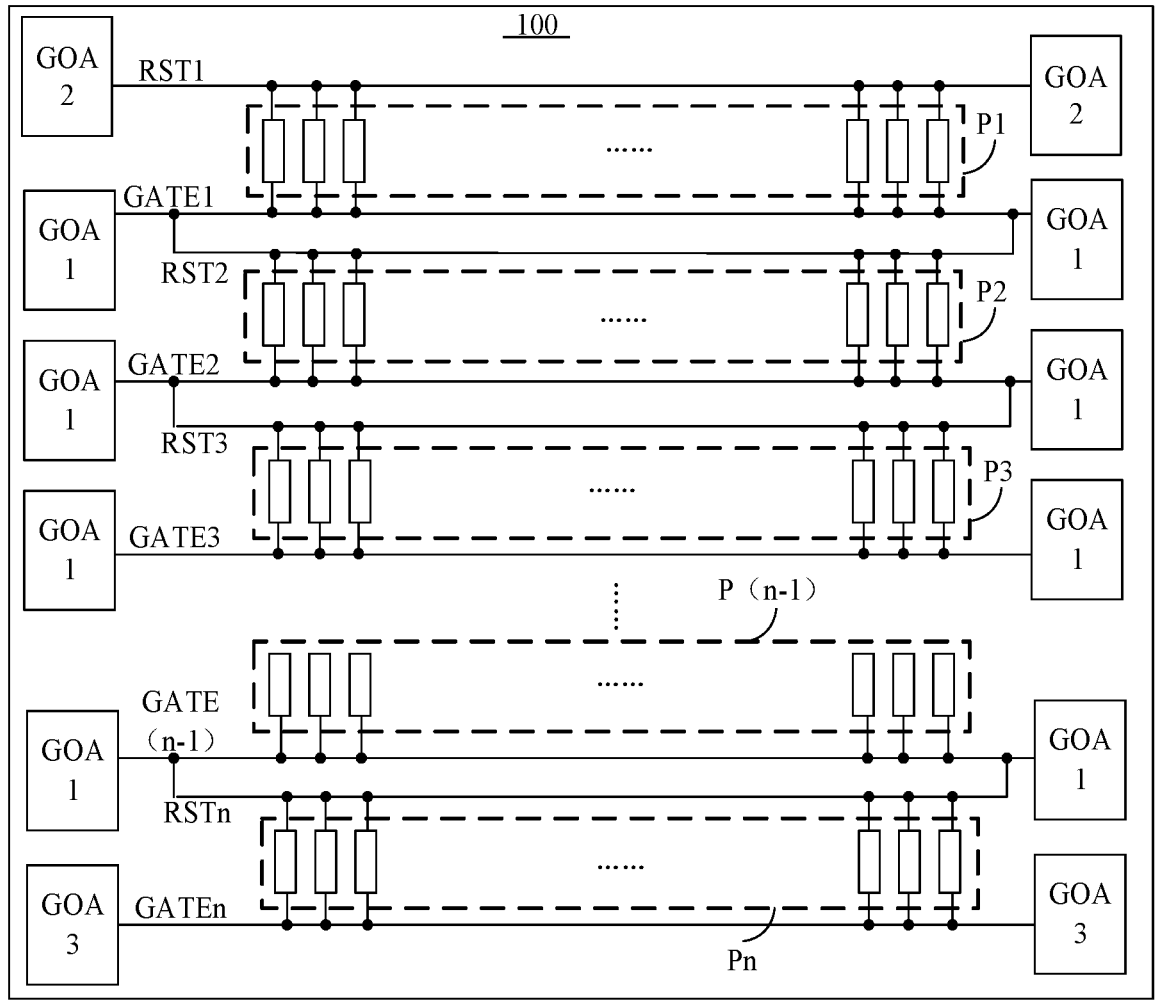
FIG. 4 is a schematic structural diagram of still another array substrate according to an embodiment of the present disclosure.

For example, FIG. 4 is a schematic structural diagram of still another array substrate according to an embodiment of the present disclosure. As shown in FIG. 4, the gate line GATE1 electrically connected to the first row of first sub-pixels P1 and the reset signal line RST2 electrically connected to the second row of first sub-pixels P2 may be both electrically connected to two first gate drive circuits 10 (i.e., the two GOA1s shown in FIG. 4) disposed on the left and right sides of the array substrate 100. The gate line GATE2 electrically connected to the second row of first sub-pixels P2 and the reset signal line RST3 electrically connected to the third row of first sub-pixels P3 may be electrically connected to two first gate drive circuits 10 (i.e., the other two GOA1s shown in FIG. 4) disposed on the left and right sides of the array substrate; and so on. Moreover, the reset signal line RST1 electrically connected to the first row of first sub-pixels P1 may be electrically connected to two second gate drive circuits 20 (i.e., the two GOA2s shown in FIG. 4) oppositely disposed on the left and right sides of the array substrate 100. The gate line GATEn electrically connected to the last row of first sub-pixels Pn may be electrically connected to two third gate drive circuits 30 (i.e., two GOA3 shown in FIG. 4) oppositely disposed on the left and right sides of the array substrate 100.

For each row of the plurality of rows of first sub-pixels, by disposing the signal lines electrically connected thereto to be electrically connected to two gate drive circuits, the two gate drive circuits may be controlled to provide signals to the row of the plurality of rows of first sub-pixels by the signal lines electrically connected thereto simultaneously to drive the row of the plurality of rows of first sub-pixels to emit light. Accordingly, it may be ensured that along the extension direction of the gate line, both one end and the other end of the row of the plurality of rows of first sub-pixels can emit light simultaneously, which improves the driving efficiency of driving each row of the plurality of rows of first sub-pixels. For an array substrate with a higher resolution (i.e., an array substrate with a larger number of first sub-pixels included in each row), the driving efficiency is improved significantly.

Figure 5:
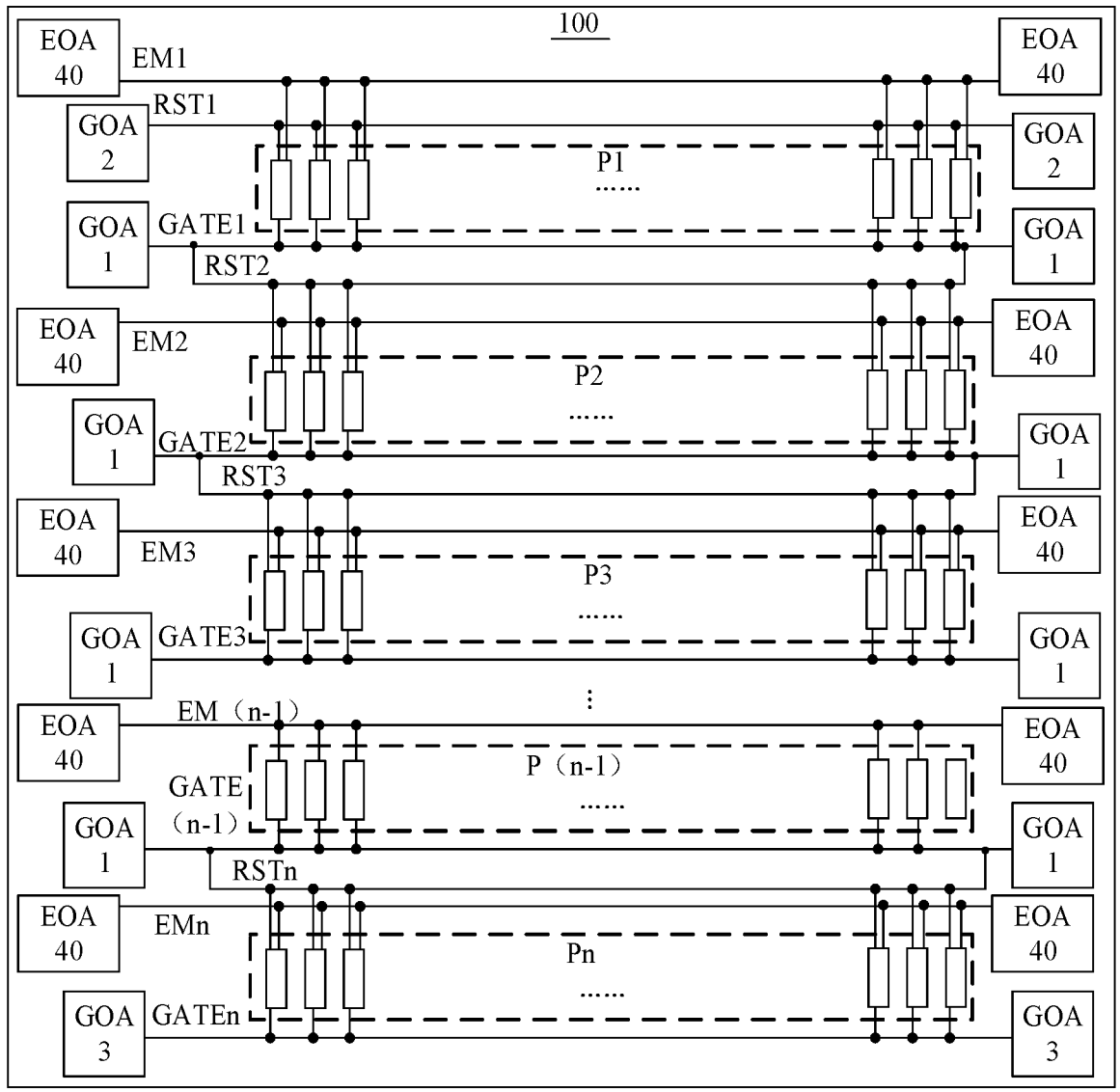
FIG. 5 is a schematic structural diagram of still another array substrate according to an embodiment of the present disclosure.

Optionally, FIG. 5 is a schematic structural diagram of still another array substrate according to an embodiment of the present disclosure. As shown in FIG. 5, the array substrate 100 may further include:

a plurality of light emission control signal lines (n light emission control signal lines EM1 to EMn as shown in FIG. 5) disposed in the display area and the peripheral area (not shown in FIG. 5). The plurality of rows of first sub-pixels (n rows of first sub-pixels P1 to Pn as shown in FIG. 5) may be electrically connected to the plurality of light emission control signal lines (such as EM1 to EMn) in one-to-one correspondence.

For example, the first row of first sub-pixels P1 may be electrically connected to a first light emission control signal line EM1. The second row of first sub-pixels P2 may be electrically connected to a second light emission control signal line EM2. The third row of first sub-pixels P3 is electrically connected to a third light emission control signal line EM3; and so on.

As an optional implementation, continuing to refer to FIG. 5, a light emission control signal line electrically connected to each row of the plurality of rows of first sub-pixels may be electrically connected to a light emission drive circuit 40. The light emission drive circuits 40 electrically connected to the light emission control signal lines electrically connected to the rows of first sub-pixels are different. Each light emission drive circuit 40 may provide a light emission control signal to the light emission control signal line electrically connected thereto. The first sub-pixel may emit light in response to the light emission control signal.

It should be noted that, similar to the gate drive circuit, the light emission drive circuit may also be provided outside the array substrate independently of the array substrate, or the light emission drive circuit 40 may be disposed on the array substrate. That is, with respect to FIG. 5, the array substrate 100 may include:

a light emission drive circuit 40 disposed in the peripheral area A2. Accordingly, the light emission drive circuit 40 may also be referred to as an emission on array (EOA) control unit. With respect to FIG. 5, the figures involved in the embodiments of the present disclosure all use EOA 40 to represent the light emission drive circuit 40. By disposing the light emission drive circuit 40 on the peripheral area A2 of the array substrate, it is also advantageous to the narrow frame design.

Alternatively, as another optional implementation, the light emission control signal lines electrically connected to the plurality of rows of first sub-pixels may be electrically connected to the same light emission drive circuit, and the first sub-pixels electrically connected to the same light emission drive circuit are disposed in different rows.

Figure 6:
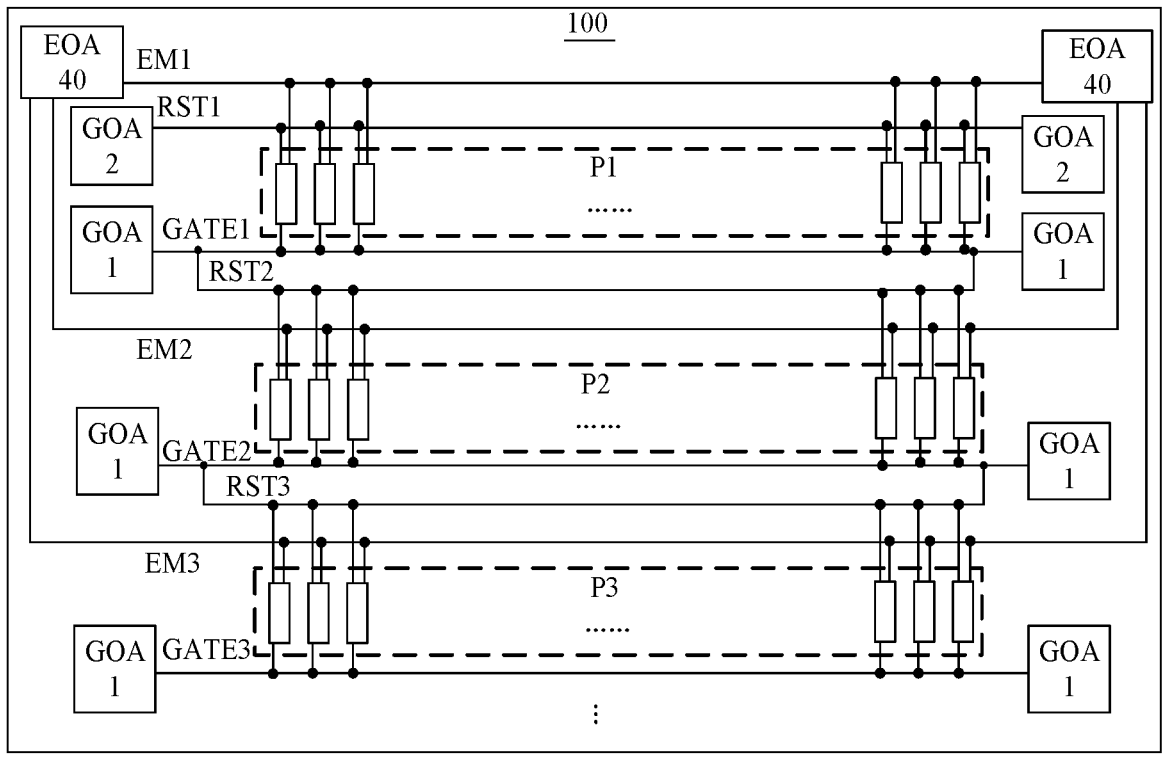
FIG. 6 is a schematic structural diagram of still another array substrate according to an embodiment of the present disclosure.

For example, FIG. 6 is a schematic structural diagram of still another array substrate according to an embodiment of the present disclosure. As shown in FIG. 6, in the array substrate 100 shown, every three adjacent rows of first sub-pixels may be electrically connected to the same light emission drive circuit (i.e., one EOA 40 shown in FIG. 6). Moreover, FIG. 6 also only takes the first row of first sub-pixels P1, the second row of first sub-pixels P2, and the third row of first sub-pixels P3 as an example. By arranging the plurality of rows of first sub-pixels to be electrically connected to the same light emission drive circuit, the design is further simplified.

It should be noted that, with reference to FIG. 5, the light emission drive circuits 40, namely the EOAs 40, may also be disposed on the array substrate along the extension direction perpendicular to the gate line, and adjacent EOAs 40 may be cascaded. Accordingly, each light emission drive circuit may sequentially provide a signal to the light emission control signal line EM electrically connected thereto in the order of arrangement.

Optionally, it may be seen with respect to FIGS. 1 to 6 that each row of the plurality of rows of first sub-pixels may include a plurality of first sub-pixels (each first sub-pixel is shown by a long square in FIGS. 1 to 6). The plurality of first sub-pixels may include a red sub-pixel capable of emitting red color light, a green sub-pixel capable of emitting green color light, and a blue sub-pixel capable of emitting blue color light. The structure of each first sub-pixel may be the same.

Figure 7:
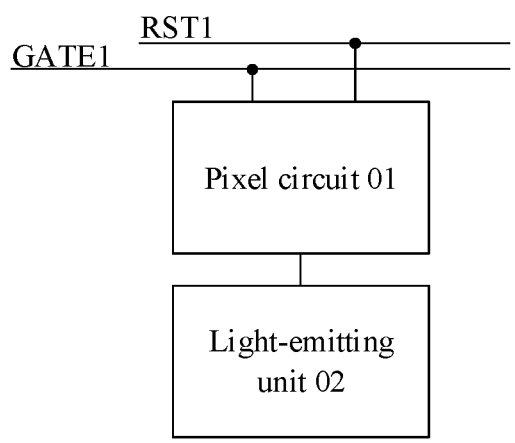
FIG. 7 is a schematic structural diagram of a first sub-pixel according to an embodiment of the present disclosure.
Figure 8:
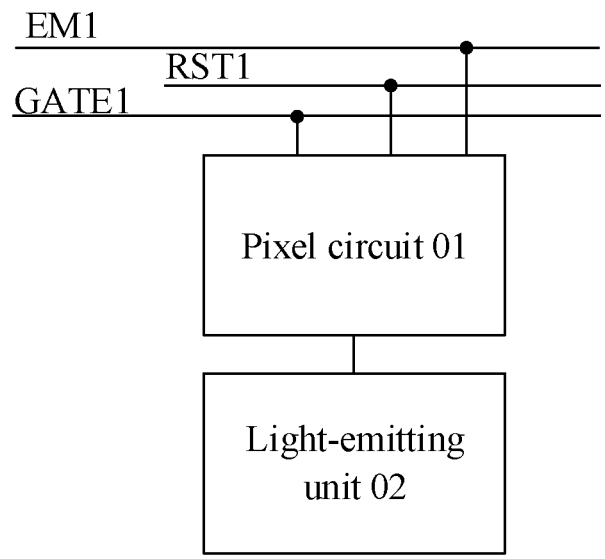
FIG. 8 is a schematic structural diagram of another first sub-pixel according to an embodiment of the present disclosure.

Taking the first sub-pixel disposed in the first column and the first row as an example, FIG. 7 shows a schematic structural diagram of a first sub-pixel according to an embodiment of the present disclosure. FIG. 8 shows a schematic structural diagram of another first sub-pixel according to an embodiment of the present disclosure. It may be seen with reference to FIGS. 7 and 8 that the first sub-pixel may include a pixel circuit 01 and a light-emitting unit 02 electrically connected to the pixel circuit 01.

As an optional implementation, referring to FIG. 7, the pixel circuit 01 may be electrically connected to the gate line GATE1, the reset signal line RST1, and the light-emitting unit 02, respectively. The pixel circuit 01 may drive the light-emitting unit 02 to emit light in response to a gate drive signal provided by the gate line GATE1 and a reset signal provided by the reset signal line RST1. For example, during normal drive, the reset signal line RST1 electrically connected to the pixel circuit 01 may first provide a reset signal to reset the pixel circuit 01. Then the gate line GATE1 electrically connected to the pixel circuit 01 may provide a gate drive signal. When the gate line GATE1 provides the gate drive signal, the reset signal line RST1 no longer provides the reset signal, and the light-emitting unit 02 emits light in response to the gate drive signal.

Optionally, the pixel circuit 01 may also be electrically connected to a data signal line that provides a data signal. When the gate line GATE1 provides the gate drive signal, the data signal may be output to the light-emitting unit 02 to drive the light-emitting unit 02 to emit light.

As another optional implementation, referring to FIG. 8, the pixel circuit may also be electrically connected to the emission control signal line EM1. Accordingly, the pixel circuit 01 may also drive the light-emitting unit to emit light in response to the gate drive signal, the reset signal, and a light emission control signal provided by the light emission control signal line EM1.

It should be noted that, for each pixel circuit, the light emission control signal line may provide the light emission control signal to the pixel circuit after the gate line electrically connected thereto provides the gate drive signal to it. By disposing the light emission control signal line, the reliable driving of the light-emitting unit 02 may be ensured.

It should also be noted that the pixel circuit according to the embodiments of the present disclosure may have a structure of 7T1C (i.e., including 7 transistors and 1 capacitor), or other structures, such as 9T2C (i.e., including 9 transistors and 2 capacitors). The embodiment of the present disclosure does not limit the specific structure of the pixel circuit.

Figure 9:
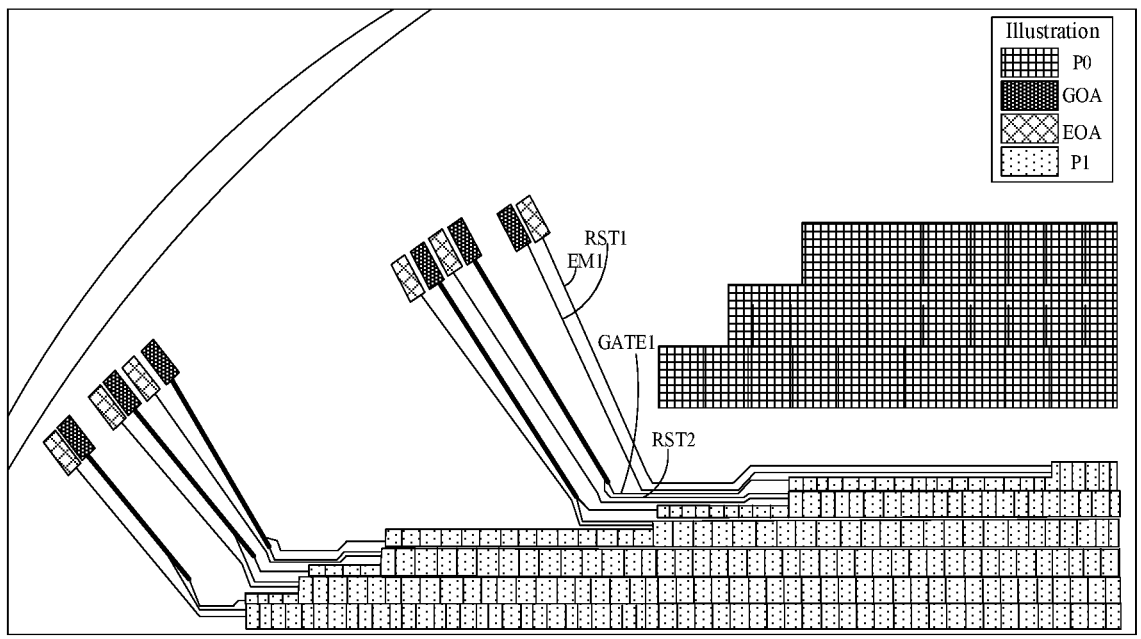
FIG. 9 is a schematic diagram of partial layout of an array substrate according to an embodiment of the present disclosure.
Figure 10:
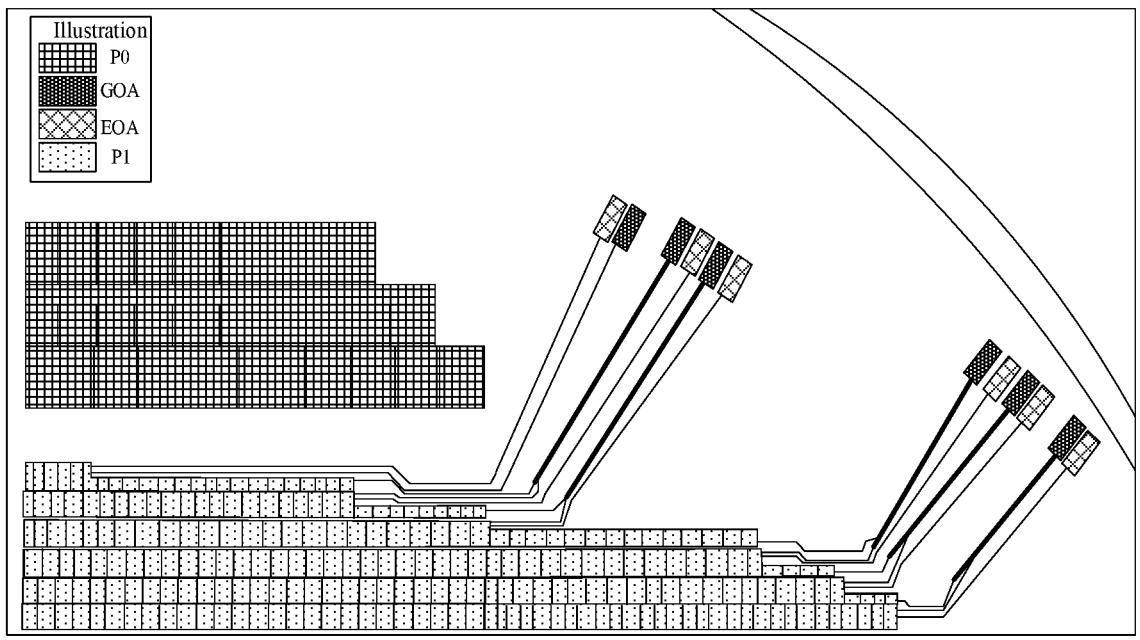
FIG. 10 is a schematic diagram of a partial layout of another array substrate according to an embodiment of the present disclosure.

FIG. 9 is a schematic diagram of a partial layout (left part) of an array substrate according to an embodiment of the present disclosure. FIG. 10 is a schematic diagram of a partial layout (right part) of an array substrate according to an embodiment of the present disclosure.

With reference to FIGS. 9 and 10, it may be seen that the reset signal line RST1 electrically connected to the first row of the plurality of rows of first sub-pixels of the display area is electrically connected to the first one of the gate drive circuits; the light emission control signal line EM1 electrically connected to the first row of the plurality of rows of first sub-pixels is electrically connected to the first one of the light emission drive circuits; the gate line GATE1 electrically connected to the first row of the plurality of rows of first sub-pixels and the reset signal line RST2 electrically connected to the second row of the plurality of rows of first sub-pixels are electrically connected to the same gate drive circuit. The same applies to other lines, which will not be repeated here.

In addition, it may also be seen that the left and right sides of the array substrate shown in FIG. 9 and FIG. 10 are arc-shaped. The array substrate may also include a plurality of rows of second sub-pixels P0 that are not electrically connected to any signal lines disposed in the peripheral area (not shown in FIGS. 9 and 10) and on one side of the second gate drive circuit 20 distal from the first gate drive circuit 10. The plurality of rows of second sub-pixels P0 may be non-luminous pixels. Since the second sub-pixel P0 does not emit light, the second sub-pixel P0 may also be referred to as a dummy sub-pixel.

In summary, the embodiment of the present disclosure provides an array substrate. With respect to the electrical connection relationship of the first sub-pixels, the signal lines, and the gate drive circuits of the array substrate, it may be seen that during normal operation, each gate drive circuit may be flexibly controlled to provide a signal to a signal line electrically connected thereto to realize reliable progressive driving of the first sub-pixels. In addition, since there are no non-luminous dummy sub-pixels in the display area of the array substrate, compared to the array substrate in the related art, the array substrate can not only display normally, but also has a simpler design.

Figure 11:
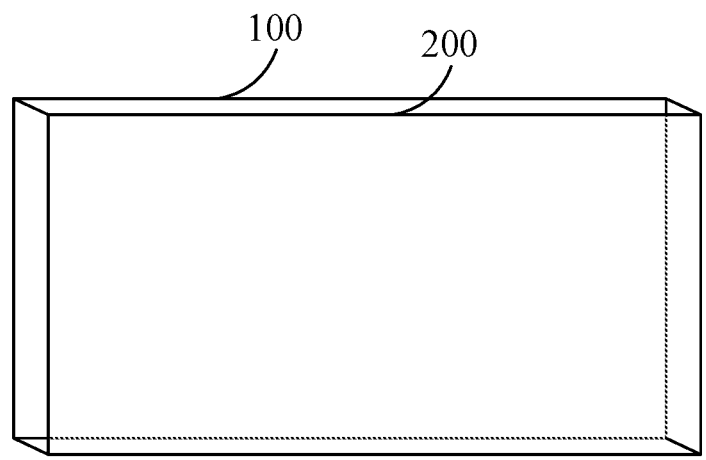
FIG. 11 is a schematic structural diagram of a display panel according to an embodiment of the present disclosure.

FIG. 11 is a schematic structural diagram of a display panel according to an embodiment of the present disclosure. As shown in FIG. 11, the display panel may include an encapsulation cover plate 200 and an array substrate 100 as shown in FIGS. 1 to 6, 9 and 10.

Figure 12:
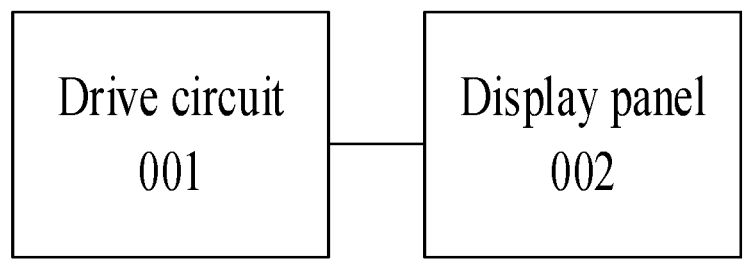
FIG. 12 is a schematic structural diagram of a display device according to an embodiment of the present disclosure.

FIG. 12 is a schematic structural diagram of a display panel according to an embodiment of the present disclosure. As shown in FIG. 12, the display panel may include a drive circuit 001 and a display panel 002 as shown in FIG. 11.

The drive circuit 001 may be electrically connected to the display panel 002. The drive circuit 001 may be configured to drive the display panel to operate. For example, the drive circuit may be a source drive circuit.

Optionally, the display device may be an AMOLED display device, a mobile phone, a tablet computer, a television, a monitor, a notebook computer, a digital photo frame, a navigator, or any other product or component with a display function.

It should be understood that the "and/or" mentioned herein means that there may be three relationships. For example, A and/or B may represent: A alone exists, A and B exist simultaneously, and B alone exists. The character "/" generally indicates that the associated objects are in an "or" relationship.

The above descriptions are only preferred embodiments of the present disclosure, and are not intended to limit the present disclosure. Any modifications, equivalent replacements, improvements, and the like made within the spirit and principle of the present disclosure shall be included in the scope of protection of the present disclosure.

What is claimed is:

1. An array substrate, comprising:
   a base substrate provided with a display area and a peripheral area surrounding the display area;
   a plurality of rows of first sub-pixels disposed in the display area, the first sub-pixels being luminous pixels, and a boundary of the plurality of rows of first sub-pixels being a boundary of the display area;
   a plurality of gate lines disposed in the display area and the peripheral area, the plurality of rows of first sub-pixels being electrically connected to the plurality of gate lines in one-to-one correspondence;
   a plurality of reset signal lines disposed in the display area and the peripheral area, the plurality of rows of first sub-pixels being electrically connected to the plurality of reset signal lines in one-to-one correspondence; wherein
   in each two adjacent rows of first sub-pixels, a gate line electrically connected to one row of first sub-pixels and a reset signal line electrically connected to another row of first sub-pixels are electrically connected to a same one or more first gate drive circuits; and
   a first target line connected to a first row of first sub-pixels is electrically connected to one or more second gate drive circuits; and a second target line connected to a last row of first sub-pixels is electrically connected to one or more third gate drive circuits;
   wherein the first target line is one of the plurality of gate lines and the second target line is one of the plurality of reset signal lines, or the first target line is one of the plurality of reset signal lines and the second target line is one of the plurality of gate lines.

2. The array substrate according to claim 1, wherein in each two adjacent rows of first sub-pixels, a gate line electrically connected to an odd-numbered row of first sub-pixels and a reset signal line electrically connected to an even-numbered row of first sub-pixels are electrically connected to the same one or more first gate drive circuits; and
   the first target line is one of the plurality of reset signal lines, and the second target line is one of the plurality of gate lines.

3. The array substrate according to claim 1, wherein in each two adjacent rows of first sub-pixels, a reset signal line electrically connected to an odd-numbered row of first sub-pixels and a gate line electrically connected to an even-numbered row of first sub-pixels are electrically connected to the same one or more first gate drive circuits; and
   the first target line is one of the plurality of gate lines, and the second target line is one of the plurality of reset signal lines.

4. The array substrate according to claim 1, wherein in each two adjacent rows of first sub-pixels, the gate line electrically connected to one row of first sub-pixels is connected to the reset signal line electrically connected to another row of first sub-pixels and both are electrically connected to the same one or more first gate drive circuits by the gate line.

5. The array substrate according to claim 1, comprising:
   a plurality of first gate drive circuits disposed in the peripheral area;
   the one or more second gate drive circuits disposed in the peripheral area and on one side of the plurality of first gate drive circuits; and
   the one or more third gate drive circuits disposed in the peripheral area and on one side of the plurality of first gate drive circuits distal from the second gate drive circuit.

6. The array substrate according to claim 1, wherein in each two adjacent rows of first sub-pixels, the gate line electrically connected to one row of first sub-pixels and the reset signal line electrically connected to another row of first sub-pixels are electrically connected to the same one first gate drive circuit.

7. The array substrate according to claim 1, wherein in each two adjacent rows of first sub-pixels, the gate line electrically connected to one row of first sub-pixels and the reset signal line connected to another row of first sub-pixels are electrically connected to the same two first gate drive circuits.

8. The array substrate according to claim 7, wherein the same two first gate drive circuits are individually disposed at two ends of the two adjacent rows of first sub-pixels.

9. The array substrate according to claim 1, wherein the first target line electrically connected to the first row of first sub-pixels is electrically connected to two second gate drive circuits, and the second target line electrically connected to the last row of first sub-pixels is electrically connected to two third gate drive circuits.

10. The array substrate according to claim 1, further comprising:
a plurality of light emission control signal lines disposed in the display area and the peripheral area, the plurality of rows of first sub-pixels being electrically connected to the plurality of light emission control signal lines in one-to-one correspondence.

11. The array substrate according to claim 10, wherein the plurality of light emission control signal lines are electrically connected to a plurality of light emission drive circuits in one-to-one correspondence.

12. The array substrate according to claim 10, wherein the plurality of light emission control signal lines are connected to one light emission drive circuit.

13. The array substrate according to claim 11, comprising: the light emission drive circuit disposed in the peripheral area.

14. The array substrate according to claim 1, wherein each first sub-pixel comprises a light-emitting unit and a pixel circuit electrically connected to the light-emitting unit; and
the pixel circuit is further electrically connected to a gate line and a reset signal line corresponding to the first sub-pixel, and the pixel circuit is configured to drive the light-emitting unit to emit light in response to a gate drive signal provided by the gate line and a reset signal provided by the reset signal line.

15. The array substrate according to claim 14, wherein the pixel circuit is also electrically connected to the light emission control signal line; and
the pixel circuit is configured to drive the light-emitting unit to emit light in response to the gate drive signal, the reset signal, and a light emission control signal provided by the light emission control signal line.

16. The array substrate according to claim 1, further comprising:
a plurality of rows of second sub-pixels disposed in the peripheral area and on one side of the second gate drive circuit distal from the first gate drive circuit, the second sub-pixels being non-luminous pixels.

17. A display panel, comprising: a packaging cover plate and an array substrate; wherein the array substrate comprises:
a base substrate provided with a display area and a peripheral area surrounding the display area;
a plurality of rows of first sub-pixels disposed in the display area, the first sub-pixels being luminous pixels, and a boundary of the plurality of rows of first sub-pixels being a boundary of the display area;
a plurality of gate lines disposed in the display area and the peripheral area, the plurality of rows of first sub-pixels being electrically connected to the plurality of gate lines in one-to-one correspondence;
a plurality of reset signal lines disposed in the display area and the peripheral area, the plurality of rows of first sub-pixels being electrically connected to the plurality of reset signal lines in one-to-one correspondence; wherein
in each two adjacent rows of first sub-pixels, a gate line electrically connected to one row of first sub-pixels and a reset signal line electrically connected to another row of first sub-pixels are electrically connected to a same one or more first gate drive circuits; and
a first target line connected to a first row of first sub-pixels is electrically connected to one or more second gate drive circuits; and a second target line connected to a last row of first sub-pixels is electrically connected to one or more third gate drive circuits;
wherein the first target line is one of the plurality of gate lines and the second target line is one of the plurality of reset signal lines, or the first target line is one of the plurality of reset signal lines and the second target line is one of the plurality of gate lines.

* * * * *